(12) United States Patent
Yoshida et al.

(10) Patent No.: US 9,774,808 B2
(45) Date of Patent: Sep. 26, 2017

(54) DRIVING METHOD FOR PHOTOELECTRIC CONVERSION APPARATUS, PHOTOELECTRIC CONVERSION APPARATUS, AND IMAGING SYSTEM

(71) Applicant: CANON KABUSHIKI KAISHA, Tokyo (JP)

(72) Inventors: Daisuke Yoshida, Ebina (JP); Seiji Hashimoto, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/815,759

(22) Filed: Jul. 31, 2015

(65) Prior Publication Data
US 2016/0037091 A1  Feb. 4, 2016

(30) Foreign Application Priority Data
Aug. 4, 2014  (JP) .................................. 2014-158961

(51) Int. Cl.
| | |
|---|---|
| H04N 5/335 | (2011.01) |
| H04N 5/3745 | (2011.01) |
| H04N 3/14 | (2006.01) |
| H04N 5/374 | (2011.01) |
| H04N 5/378 | (2011.01) |

(Continued)

(52) U.S. Cl.
CPC .......... *H04N 5/37457* (2013.01); *H03M 1/18* (2013.01); *H04N 3/155* (2013.01); *H04N 5/243* (2013.01); *H04N 5/3355* (2013.01); *H04N 5/355* (2013.01); *H04N 5/374* (2013.01); *H04N 5/378* (2013.01); *H04N 5/3742* (2013.01); *H04N 5/37455* (2013.01); *H03M 1/56* (2013.01)

(58) Field of Classification Search
None
See application file for complete search history.

(56) References Cited

U.S. PATENT DOCUMENTS

2006/0119427 A1\* 6/2006 Roos ....................... H03M 1/18
330/86
2008/0024630 A1 1/2008 Hiyama
(Continued)

FOREIGN PATENT DOCUMENTS

| | | |
|---|---|---|
| EP | 1538827 A1 | 6/2005 |
| JP | 2002-320146 A | 10/2002 |

(Continued)

OTHER PUBLICATIONS

Masaki Sakakibara, et al.; "A High-Sensitive CMOS Image Sensor with Gain-Adaptive Column Amplifiers"; IEEE Journal of Solid-State Circuits; May 2005; pp. 1147-1156; vol. 40, No. 5.

(Continued)

*Primary Examiner* — Mark T Monk
(74) *Attorney, Agent, or Firm* — Canon USA, Inc. IP Division

(57) ABSTRACT

In a state that a plurality of capacitances are connected between input and output nodes of an amplifier, a short circuit is established between the input and output nodes of the amplifier. In a state that at least one of the capacitances is isolated from the input and output nodes of the amplifier, the plurality of capacitances are connected to the input and output nodes of the amplifier, in a case that an output from the amplifier is larger than a threshold.

18 Claims, 12 Drawing Sheets

(51) Int. Cl.
    *H04N 5/243*     (2006.01)
    *H04N 5/355*     (2011.01)
    *H03M 1/18*     (2006.01)
    *H03M 1/56*     (2006.01)

(56) References Cited

U.S. PATENT DOCUMENTS

| | | | |
|---|---|---|---|
| 2011/0134295 A1* | 6/2011 | Shigeta | H04N 5/355 348/300 |
| 2012/0056630 A1* | 3/2012 | Itou | G01P 15/125 324/679 |
| 2013/0194468 A1* | 8/2013 | Okita | H04N 5/343 348/294 |
| 2013/0229543 A1 | 9/2013 | Hashimoto | |

FOREIGN PATENT DOCUMENTS

| | | |
|---|---|---|
| JP | 2003-172611 A | 6/2003 |
| JP | 2005-175517 A | 6/2005 |
| WO | 2012043867 A1 | 4/2012 |

OTHER PUBLICATIONS

Michael Schanz, et al.; "A High-Dynamic-Range CMOS Image Sensor for Automotive Applications"; IEEE Journal of Solid-State Circuits; Jul. 2000; pp. 932-938; vol. 35, No. 7.

Nobuhiro Kawai, et al.; "Noise Analysis of High-Gain, Low-Noise Column Readout Circuits for CMOS Image Sensors"; IEEE Transactions on Electron Devices; Feb. 2004; pp. 185-194; vol. 51, No. 2.

* cited by examiner

FIG. 5

| ATT = L LEVEL | r_ gain | | | |
| --- | --- | --- | --- | --- |
| | 00 | 01 | 10 | 11 |
| s0 | on | on | on | off |
| s1 | on | on | off | off |
| s2 | on | off | off | off |
| s3 | off | off | off | off |
| s4 | off | off | off | off |

| ATT = H LEVEL | r_ gain | | | |
| --- | --- | --- | --- | --- |
| | 00 | 01 | 10 | 11 |
| s0 | on | on | on | on |
| s1 | on | on | on | on |
| s2 | on | on | on | off |
| s3 | on | on | off | off |
| s4 | on | off | off | off |

DRIVING METHOD FOR PHOTOELECTRIC CONVERSION APPARATUS, PHOTOELECTRIC CONVERSION APPARATUS, AND IMAGING SYSTEM

BACKGROUND OF THE INVENTION

Field of the Invention

The present invention relates to a driving method for a photoelectric conversion apparatus, and it particularly relates to a driving method for a photoelectric conversion apparatus including a variable gain amplifier, a photoelectric conversion apparatus, and an imaging system.

Description of the Related Art

In the imaging apparatus field, a high S/N ratio and a wide dynamic range have been desirable. Japanese Patent Laid-Open No. 2005-175517 discloses a variable gain amplification unit provided in each column of a pixel array for an enlarged dynamic range with a higher S/N ratio kept. Japanese Patent Laid-Open No. 2005-175517 further discloses setting a gain of the amplification unit based on a result of detection of a signal level of an output signal from the amplification unit.

A configuration example of the amplification unit is further disclosed therein in which capacitative elements having different capacitance values from each other are provided in parallel in a feedback path of the amplifier (FIG. 14). The capacitative element to be electrically connected to the feedback path may be switched to switch the gain of the amplification unit.

Japanese Patent Laid-Open No. 2005-175517, however, does not disclose what kind of sequence is applied to switch the capacitative elements provided on the feedback path. The present inventor has found that some sequences for switching the connection of the capacitative elements provided in the feedback path may cause an offset error.

SUMMARY OF THE INVENTION

There is provided a driving method for a photoelectric conversion apparatus, the photoelectric conversion apparatus including a pixel array having a plurality of pixels arranged in a matrix form, and a plurality of column signal processing units each provided corresponding to a column of the pixel array, each of the column signal processing units including a column amplification unit having an amplifier, a first capacitance provided between input and output nodes of the amplifier, and a second capacitance provided in parallel with the first capacitance, and amplifying a signal output from the pixel array. The method includes establishing a short circuit between an input node and an output node of the amplifier in a state that the first and the second capacitances are both connected between the input node and output node of the amplifier, and, in a state that the first or second capacitance is isolated from the input and output nodes of the amplifier, connecting the first and second capacitances to the input and output nodes of the amplifier in a case an output from the amplifier is larger than a threshold.

Further features of the present invention will become apparent from the following description of exemplary embodiments with reference to the attached drawings.

BRIEF DESCRIPTION OF THE DRAWINGS

FIG. 5 illustrates a setting example of amplification factors for the column amplification unit.

DESCRIPTION OF THE EMBODIMENTS

First Embodiment

Figure 1A:
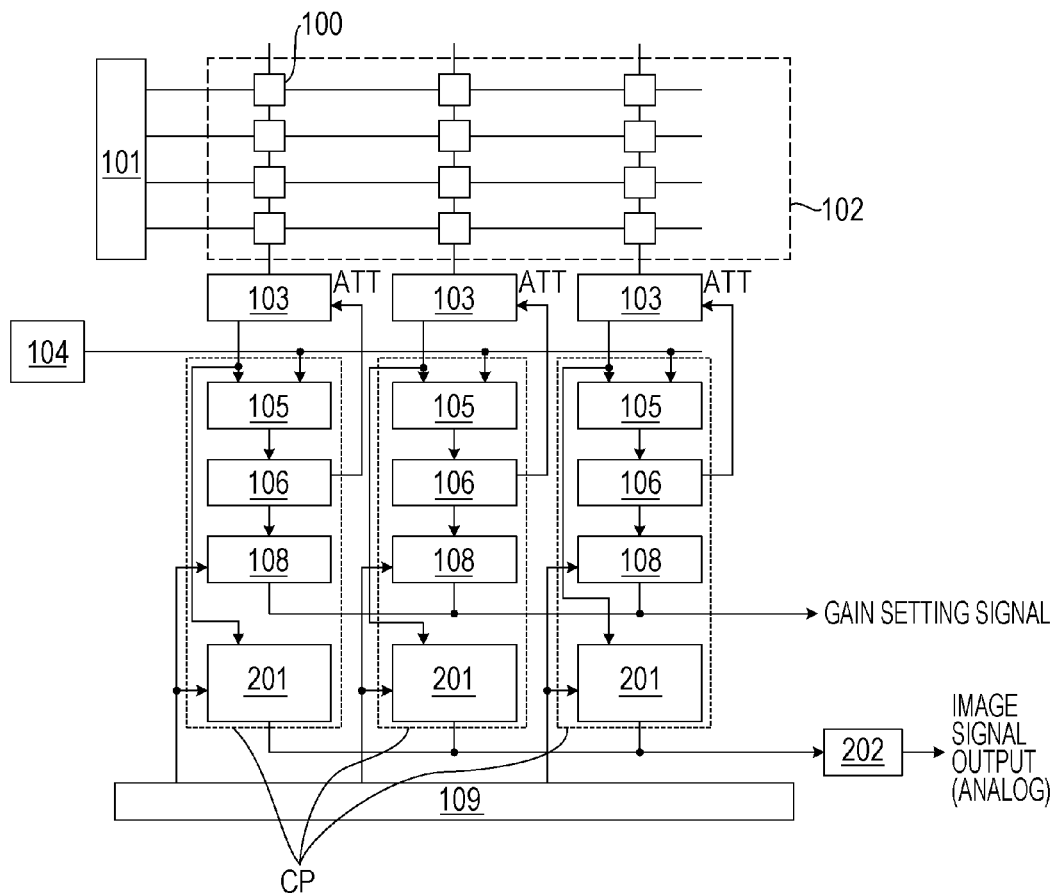
FIGS. 1A and 1B are block diagrams illustrating a configuration example of a photoelectric conversion apparatus.

FIG. 1A is a block diagram illustrating a configuration example of a photoelectric conversion apparatus according to a first embodiment. The photoelectric conversion apparatus includes a pixel array 102 having a plurality of pixels 100 arranged in a matrix form. A variable gain column amplification unit 103 and an analog memory 201 are provided for each column in the pixel array. A column comparison unit 105, a column control unit 106, and a digital memory 108 are provided for each of the column amplification units 103. The photoelectric conversion apparatus further includes a vertical scanning unit 101 configured to control the pixels 100 in rows, a reference signal generation unit 104 configured to generate a reference signal, and a horizontal scanning unit 109 configured to control the digital memory 108 and analog memory 201. The photoelectric conversion apparatus may further include an output buffer 202 configured to buffer and output a signal output from the analog memory 201. According to this embodiment, the column amplification unit 103, analog memory 201, column comparison unit 105, column control unit 106 and memory 108 will be collectively called a column signal processing unit.

Signals output from the pixels 100 in a column are amplified in the corresponding column amplification unit 103. Each of the column amplification units 103 has an output node connected to input nodes of the corresponding column comparison unit 105 and analog memory 201. The column comparison unit 105 compares a signal output from the column amplification unit 103 and a reference signal supplied from the reference signal generation unit 104 and outputs the result as a comparison result signal to the column control unit 106. The column control unit 106 supplies the comparison result signal to the digital memory 108 and supplies a gain setting signal ATT to the column amplification unit 103 in accordance with the comparison result signal. The column amplification unit 103 has a gain which is set based on the gain setting signal ATT. The horizontal scanning unit 109 selects the digital memory 108 and analog memory 201 in each column, and signals held therein are output to a circuit in a following stage. It is assumed here that the following switches are turned on when a control signal has a high level and are turned off when a control signal has a low level.

Figure 1B:
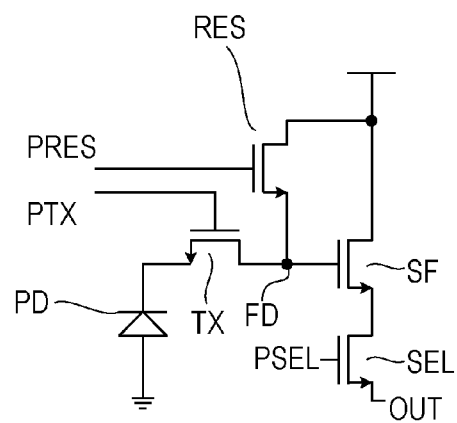

FIG. 1B is an equivalent circuit diagram illustrating a configuration example of each of the pixels 100. Each of the pixels 100 includes a photo diode PD which is a photoelectric conversion pixel, a transfer transistor TX, a reset transistor RES, an amplifying transistor SF, and a selection transistor SEL. When the transfer transistor TX is turned on in response to a signal PTX, charges generated in the photo diode PD are transferred to a capacitance present in a gate node of the amplifying transistor SF. The node will be called a floating diffusion part FD. When the selection transistor is turned on in response to the signal PEEL, the amplifying transistor SF configures a source follower circuit along with a current source, not illustrated, and outputs a voltage signal based on the amount of electric charges held in the floating diffusion part FD. The current source is generally provided commonly to the plurality of pixels 100. The reset transistor RES is controlled with the signal PRES and discharges the charges held in the floating diffusion part FD to the power supply.

Figure 2:
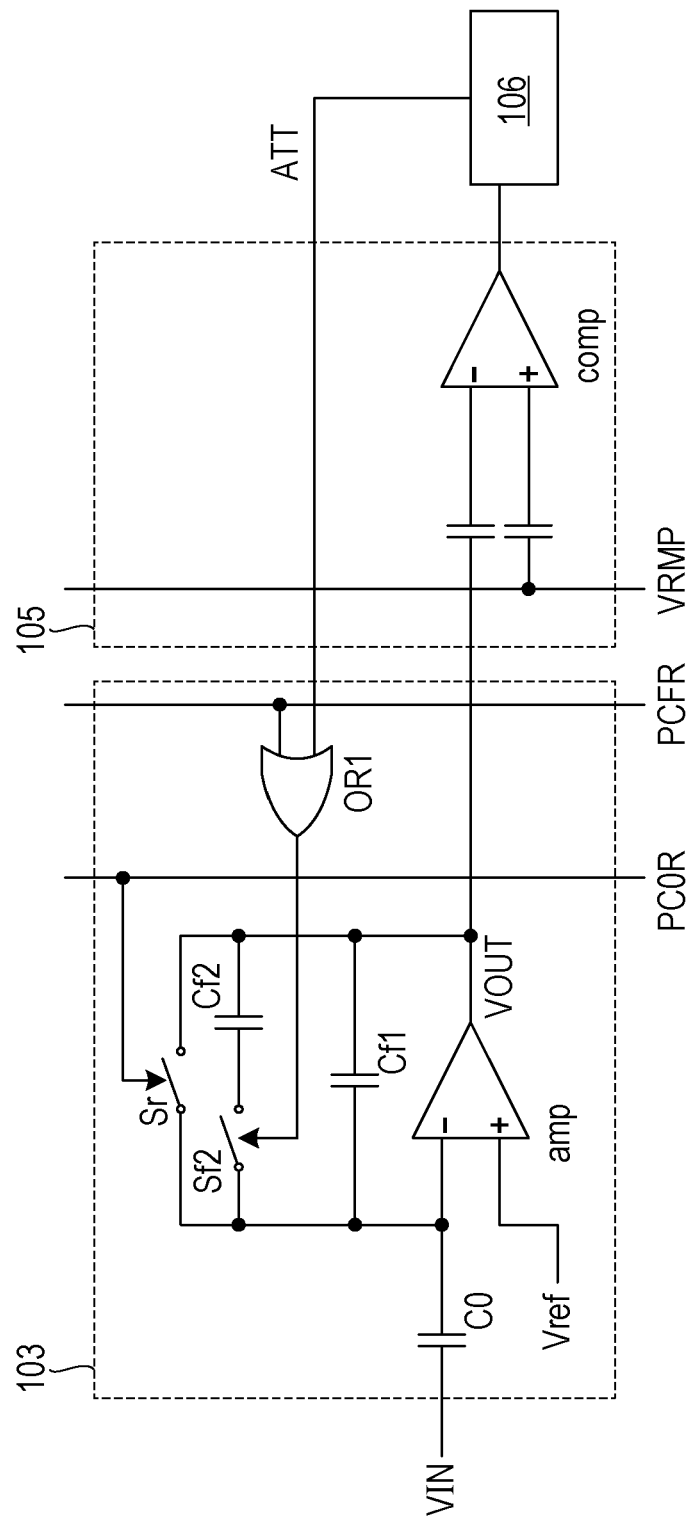
FIG. 2 illustrates a configuration example of a column signal processing unit.

FIG. 2 illustrates configuration examples of the column amplification unit 103, column comparison unit 105 and column control unit 106. The column amplification unit 103 has an input node VIN connected to an output OUT of the corresponding pixel 100 and the aforementioned current source. The column amplification unit 103 includes an input capacitance C0, an amplification unit amp, feedback capacitances Cf1 and Cf2, a switch Sf2, a column amplification unit reset switch Sr, and an OR circuit OR1. The amplification unit amp is a differential amplifier in this embodiment. The feedback capacitances Cf1 and Cf2 are provided between input and output nodes of the amplification unit amp which is an amplifier. The OR circuit OR1 outputs a signal corresponding to a logical sum of the signal ATT output from the column control unit 106 and a signal PCFR output from a timing control unit, not illustrated and switches on or off the switch Sf2. The switch Sr is switched on or off in accordance with a signal PCOR. The column amplification unit 103 has a gain depending on a ratio between a value of a capacitance connected to a feedback path of the amplification unit amp and a capacitance value of the input capacitance C0. When the switch Sf2 has an ON state, the column amplification unit 103 has a gain of $-\{C0/(Cf1+Cf2)\}$. When the switch Sf2 has an OFF state, the column amplification unit has a gain of $-(C0/Cf1)$. This embodiment assumes that the input capacitance C0 and feedback capacitances Cf1 and Cf2 have capacitance values C0, C0, 3*C0, respectively. In other words, when the switch Sf2 has an ON state, the gain is ¼ times. When the switch Sf2 has an OFF state, the gain is 1 time. According to this embodiment, the switch Sf2 is provided between an inverting input terminal of the amplification unit amp and the feedback capacitance Cf2. However, the switch Sf2 may be provided in parallel with the feedback capacitance Cf1 and switch Sr in the path between the output terminal of the amplification unit amp and the feedback capacitance Cf2. Switches controlled by signals having an identical phase may be provided across the feedback capacitance Cf2.

The column comparison unit 105 includes a comparator comp having input nodes both connected to capacitances. An output from the column amplification unit 103 is input to one input node of the comparator comp through the capacitance, and a reference signal VRMP is input to the other input node of the comparator comp through the other capacitance. A comparison result signal output from the comparator comp is supplied to the column control unit 106.

Figure 3:
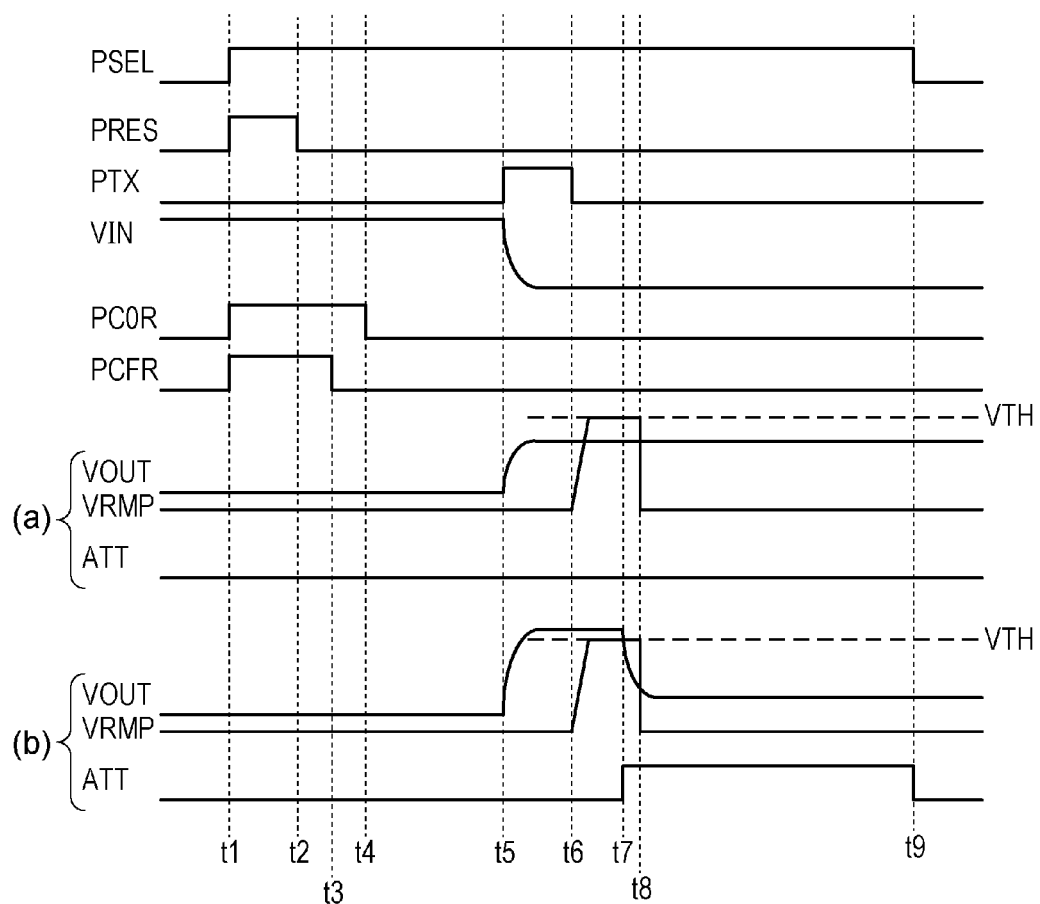
FIG. 3 is a timing chart for explaining operations according to a first embodiment.

FIG. 3 is a timing chart for explaining operations according to this embodiment. FIG. 3 illustrates signals to be supplied to each of the pixels 100 and signals associated with the column amplification unit 103, column comparison unit 105, and column control unit 106. Section (a) in FIG. 3 illustrates operations performed in a case when the signal VOUT output from the column amplification unit 103 is lower than a threshold, and Section (b) in FIG. 3 illustrates operations performed in a case where the signal VOUT output from the column amplification unit 103 is larger than the threshold. Section (a) corresponds to a case where light having lower intensity enters to a pixel from which a signal is read out (low luminance condition), for example, and Section (b) corresponds to a case where intense light enters to a pixel from which a signal is read out (high luminance condition), for example. For example, the quantity of light incident on the pixel in the Section (b) case is higher than the quantity of light incident on the pixel in the Section (a) case.

The operations to be performed when the signal VOUT output from the column amplification unit 103 is lower than a threshold will be described.

When the signal PEEL has a high level at a time t1, the selection transistor SEL is turned on, and the amplifying transistor SF operates as a source follower circuit with a current source, not illustrated. When the signal PRES has a high level at the time t1, the reset transistor RES is turned on, and the potential of the floating diffusion part FD is reset.

When the signals PCOR and PCFR have a high level at the time t1, the switches Sr and Sf2 are turned on. Thus, a short circuit is established between the input and output nodes of the amplification unit amp, and a short circuit is established between both nodes of the feedback capacitance Cf2. As a result, both nodes of the feedback capacitances Cf1 and Cf2 are reset by the output of the amplification unit amp. In this case, the amplification unit amp operates as a voltage follower circuit.

At a time t2, the signal PRES has a low level, and the reset transistor RES is turned off. Thus, a signal corresponding to the noise caused by the reset of the floating diffusion part FD is output from the pixel and appears at the input VIN of the column amplification unit.

At a time t3, the signal PCFR has a low level, and the feedback capacitance Cf2 is electrically isolated from the feedback path of the amplification unit amp.

At a time t4, the signal PCOR has a low level, and the switch Sr is turned off. Thus, the column amplification unit 103 has a gain of $-(C0/Cf1)$.

During a period from the time t5 to a time t6, when the signal PTX is turned on, charges accumulated in the photo diode PD are transferred to the floating diffusion part FD. With this, the output of the pixel, that is, VIN changes. Further with this, VOUT changes.

At the time t6, the reference signal VRMP changes to a threshold VTH. When the output of the column amplification unit 103 is lower than the threshold VTH as in Section (a) in FIG. 3, that is, when a low luminance signal is input to the column comparison unit 105, the signal ATT keeps a low level. Thus, the switch Sf2 keeps its OFF state. In other words, the column amplification unit 103 maintains a gain of $-(C0/Cf)$. On the other hand, as in Section (b) in FIG. 3, when the output of the column amplification unit 103 is larger than the threshold VTH, that is, when a high luminance signal is input to the column comparison unit 105, the signal ATT changes to a high level (time t7). Thus, the switch Sf2 is turned on, and the gain of the column amplification unit 103 is changed to $-\{C0/(Cf1+Cf2)\}$. Therefore, the output VOUT of the column amplification unit 103 attenuates. The threshold VTH may be a value corresponding to a saturation level of the output of the column amplification unit 103, for example, and a signal having a value larger than it may be determined as having the saturation level.

Even after the reference signal VRMP returns to its initial value at a time t8, the column control unit keeps the logic level of the signal ATT.

After the reference signal VRMP returns its initial value and until a time t9, the output VOUT from the column amplification unit 103 is held in the analog memory 201, and the signal ATT is held in the digital memory 108. After that, the signal held in the analog memory 201 is read out, and the signal held in the digital memory 108 is read out. Thus, which gain is applied to amplify the signal read out from the analog memory 201 may be identified by a circuit in a following stage.

Through these operations, a signal output from the pixel 100 may be amplified with an appropriate gain for a high S/N ratio and a wide dynamic range.

According to this embodiment, the two feedback capacitances Cf1 and Cf2 both electrically connected to the feedback path of the amplification unit amp are reset, and one of them is then isolated from the feedback path. When a signal output from the pixel 100 has a value larger than the threshold, the feedback capacitance isolated from the feedback path is again electrically connected to the feedback path to reduce the gain of the column amplification unit 103. Thus, the noise superimposed on the signal may be reduced when the gain of the column amplification unit 103 is switched. The reasons therefor will be described in more detail below.

In the period from the time t3 to the time t4 in FIG. 3, before the signal PCOR is changed to have a low level, the signal PCFR has a low level. Thus, the inverting input node of the amplification unit amp is reset by the output of the amplification unit amp, and the switch Sf2 is then turned off. Therefore, the noise caused by the switching off of the switch Sf2 is cancelled by the output of the amplification unit amp. In other words, with a gain of $-(C0/Cf)$, the influence of the switching noise due to the switch Sf2 may be reduced. When the output from the column amplification unit 103 is larger than the threshold, the switch Sf2 is turned on. Therefore, because charges of switching noise caused by the switching on of the switch Sf2 are divided to the two feedback capacitances Cf1 and Cf2, the influence of the switching noise may be reduced.

As described above, according to this embodiment, the occurrence of an offset may be inhibited and at the same time a higher S/N ratio and a wide dynamic range may be acquired.

Second Embodiment

Figure 4:
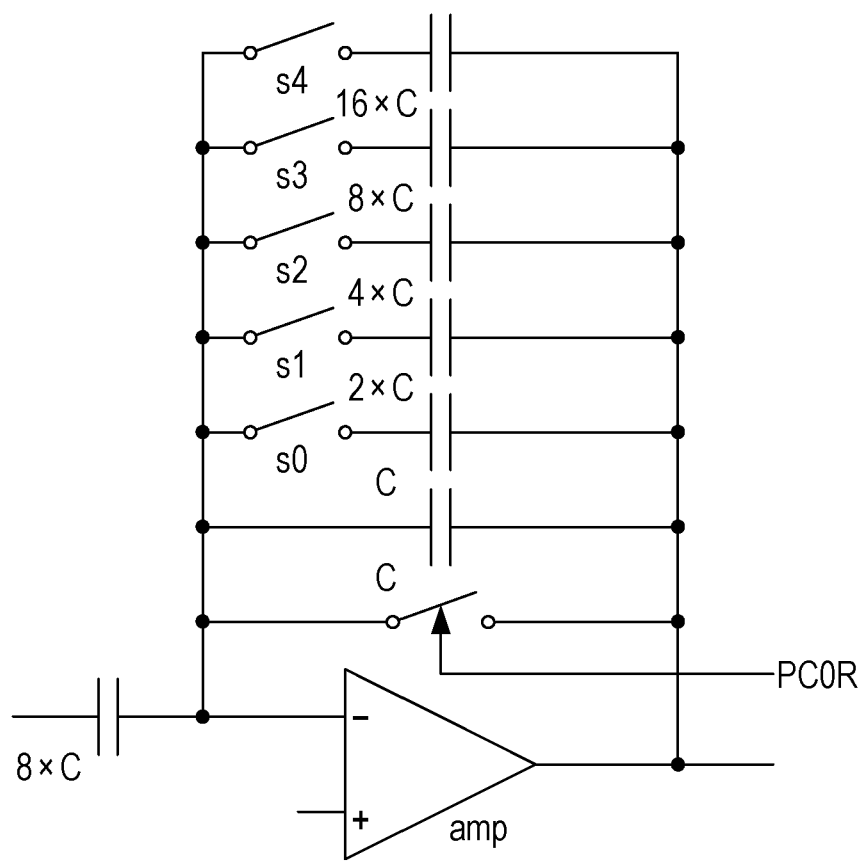
FIG. 4 illustrates a configuration example of a column amplification unit.

FIG. 4 is an equivalent circuit diagram illustrating another configuration example of the column amplification unit 103. It is different from the configuration example of the column amplification unit 103 illustrated in FIG. 2 in that more feedback capacitances are provided than that of the configuration illustrated in FIG. 2 and that different capacitance values of the input capacitance and feedback capacitances are applied. According to this embodiment, six feedback capacitances are provided which have capacitance values of C, C, 2×C, 4×C, 8×C, and 16×C, respectively. The input capacitance has a capacitance value of 8×C.

A maximum gain settable with this configuration is acquired when all of the switches s0 to s4 have an OFF state and is equal to 8×C/C=8 times. On the other hand, a minimum gain settable with this configuration is acquired when all of the switches s0 to s4 have an ON state and is equal to 8×C/(C+C+2×C+4×C+8×C+16×C)=¼ times. The configuration of this embodiment allows switching between three or more kinds of gain by changing the combination of the switches s0 to s4 to be brought into conduction.

The column amplification unit 103 according to this embodiment is a programmable gain amplifier for which four kinds of setting are possible with a 2-bit signal r_gain. When the signal ATT has an L level, it means that a low luminance signal has been input to the column amplification unit 103. When the signal ATT has an H level, it means that a high luminance signal has been input to the column amplification unit 103. FIG. 5 illustrates settings in cases where the signal ATT has an L level and where the signal STT has an H level. FIG. 5 illustrates signals r_gain with different states of the signal ATT and states of the switches s0 to s4. For example, when the set ATT has an L level and the signal r_gain has "01", the switches s0 and s1 are turned on, and the switches s2 to s4 are turned off. In this case, the gain of the column amplification unit 103 is two times. FIG. 5 illustrates an example in which four gains of one time, two times, four times and eight times are settable for the column amplification unit 103 in response to a low luminance signal, and four gains of ¼ times, ½ times, one time, and two times are settable for the column amplification unit 103 in response to a high luminance signal. The switches s0 to s4 may be controlled with one of the settings 00 to 11 of the signal r_gain as on the table illustrated in FIG. 5 so that the gain ratio between a case where the signal ATT has an L level and a case where the signal ATT has an H level may be kept at 1:¼.

The signal r_gain for determining a programmable gain may be changed in accordance with luminance information of an imaging scene or the value of ISO sensitivity set by an imaging system, for example.

According to this embodiment, individual controls over the switches s0 to s4 are allowed in accordance with the output of the column control unit 106, and at least a high level of one of the outputs of the column control unit 106 or the signal PCFR may turn on the corresponding switch.

Because the operations according to this embodiment may be the same as the operations illustrated in FIG. 3, the description will be omitted.

According to this embodiment, a high S/N ratio and a dynamic range may be acquired like the first embodiment, and switching between more gains may be allowed. Thus, more detail switching between gains of the column amplification unit 103 may be allowed in accordance with signal levels advantageously.

Third Embodiment

Figure 6:
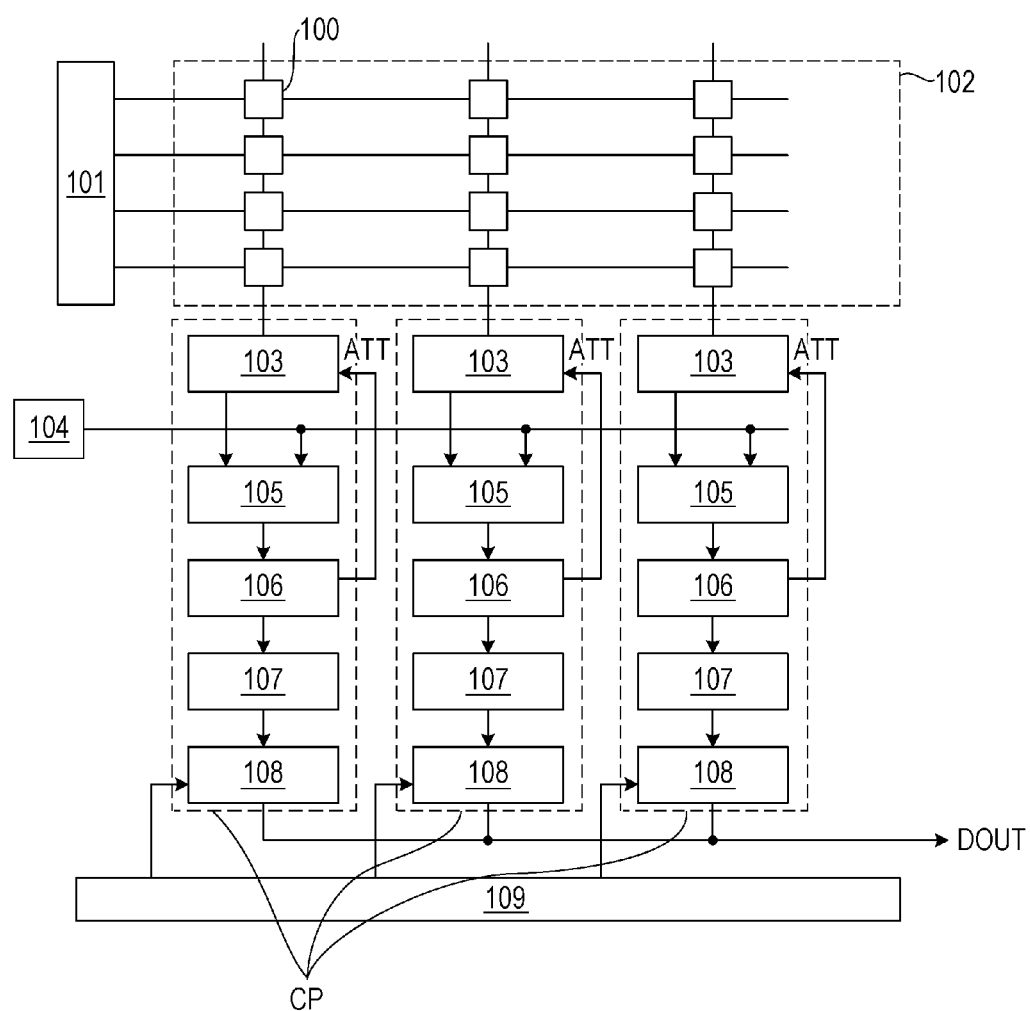
FIG. 6 is a block diagram illustrating a configuration example of a photoelectric conversion apparatus.

FIG. 6 is a block diagram illustrating a configuration of an imaging apparatus according to a third embodiment. Like numbers refer to common parts to those in the imaging apparatus illustrated in FIGS. 1A and 1B. The imaging apparatus according to this embodiment is different from the imaging apparatus illustrated in FIGS. 1A and 1B in that a reference signal generation unit 104, a column comparison unit 105, and a column counter unit 107 are used to perform an analog-digital conversion (hereinafter, called AD conversion) on a signal output from the column amplification unit 103. In other words, this embodiment is different from the aforementioned embodiments in that a column signal processing unit CP includes an AD converter.

A signal output from the column amplification unit 103 is compared in the column comparison unit 105 with a reference signal VRMP output from the reference signal generation unit 104. The reference signal VRMP is changed monotonously with time, and the column counter unit 107 is caused to perform a counting operation. Thus, counted values changed until the magnitude relationship between the output from the column amplification unit 103 and the reference signal VRMP is inverted are digital signals corresponding to the signal output from the column amplification unit 103. The digital memory 108 holds the counted values of the column counter unit 107. When the digital memories 108 in columns are selected by the horizontal scanning unit 109, the counted values held by them are output to a node DOUT.

Figure 7:
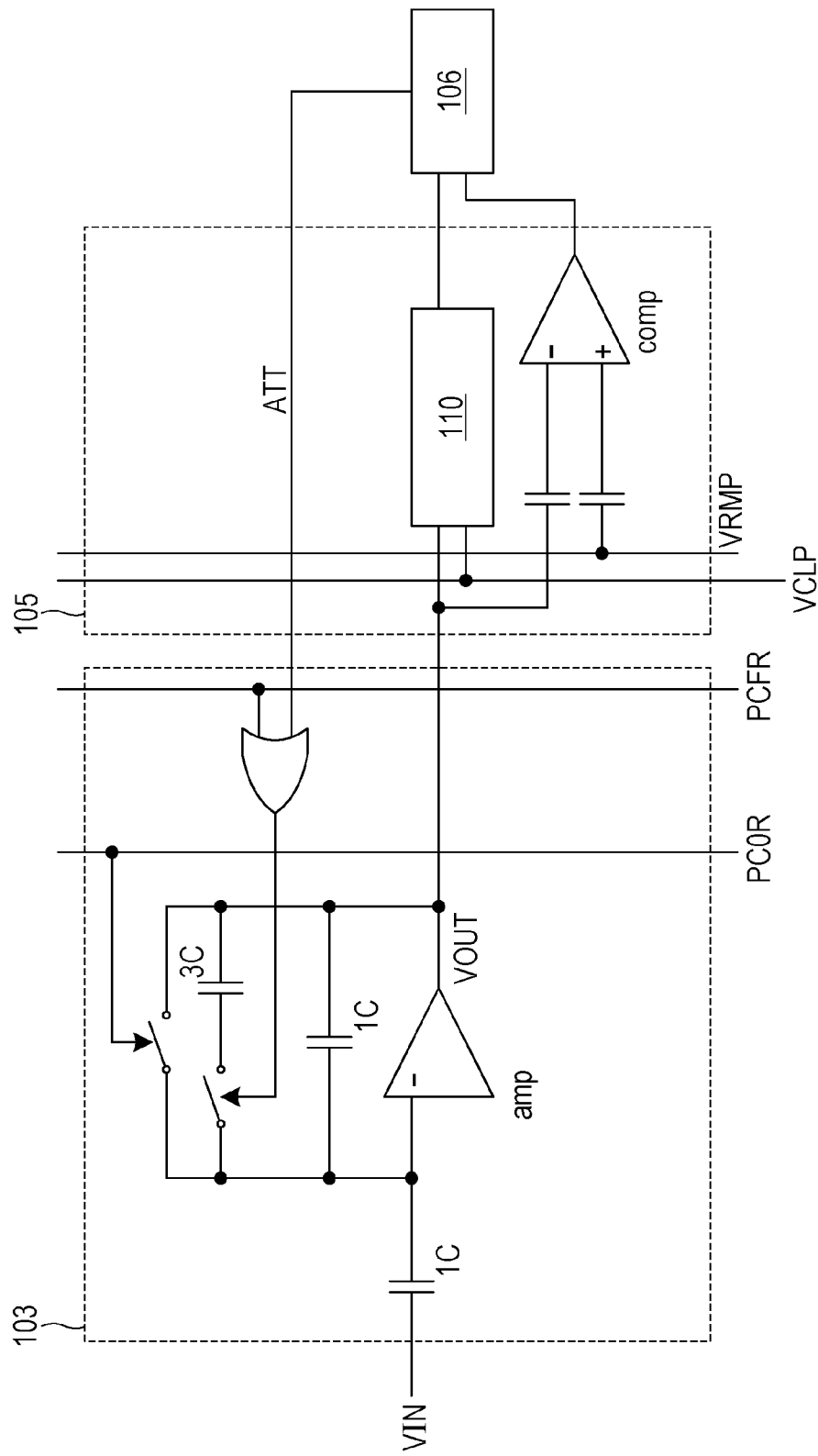
FIG. 7 illustrates a configuration example of the column signal processing unit.

FIG. 7 illustrates other configuration examples of the column amplification unit 103, column comparison unit 105 and column control unit 106. Differences from the circuit diagram in FIG. 2 will be described mainly. The column amplification unit 103 according to this embodiment is different from the column amplification unit 103 illustrated in FIG. 2 in that the amplification unit amp is not a differential amplifier.

The column comparison unit 105 according to this embodiment includes a column output limiting unit 110. The column output limiting unit 110 includes a clipping circuit which controls the output VOUT from the column amplification unit 103 so as to have a potential based on a clip voltage VCLP below a predetermined potential. Like the aforementioned embodiments, when an output from the column amplification unit 103 is larger than a threshold VTH, the column control unit 106 changes the gain of the column amplification unit 103 to a lower gain by using the signal ATT, according to this embodiment. In addition, according to this embodiment, the column output limiting unit 110 operates to switch the signal ATT in accordance with the determination result on whether the output VOUT is being limited by the column output limiting unit 110 or not.

Figure 8:
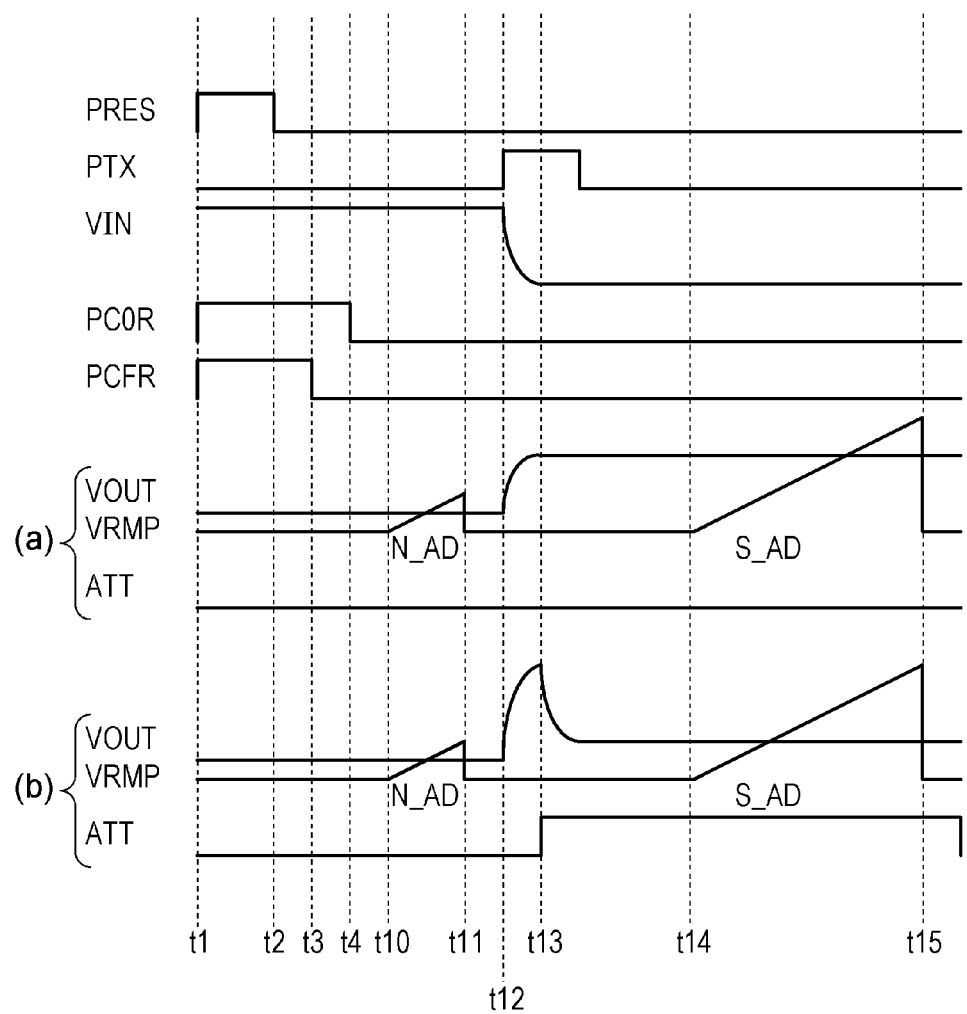
FIG. 8 is a timing chart for explaining operations according to a third embodiment.

FIG. 8 is a timing chart for explaining operations according to this embodiment. The operations will be described with reference to FIGS. 6 to 8. FIG. 8 illustrates in Section (a) an output from the column amplification unit 103, the reference signal VRMP, and the signal ATT in a case where the signal output from the column amplification unit 103 is a low luminance signal. Section (b) on the other hand illustrates an output from the column amplification unit 103, the reference signal VRMP, and the signal ATT in a case where the signal output from the column amplification unit 103 is a high luminance signal. In FIG. 8, the references (a) and (b) are not given to parts common in both of Sections (a) and (b).

Because operations during a period from a time t1 to a time t4 are the same as those illustrated in FIG. 3, the description will be omitted.

The operations occurring during a period from a time t10 to a time t11 are common in Sections (a) and (b). At the time t10, the reference signal generation unit 104 monotonically increases the reference signal VRMP from an initial value with time. If the reference signal VRMP is larger than the output VOUT from the column amplification unit 103 at a certain time, the logic level of the output from the column comparison unit 105 is inverted. In response thereto, the counting operation performed by the column counter unit 107 stops. Thus, a signal containing noise due to the reset of the column amplification unit 103 is AD converted (N_AD in FIG. 8). After the counting operation stops, the counted value is transferred to the digital memory 108.

In response to the change to a high level of the signal PTX at a time t12, charges accumulated in the photo diode PD are transferred to a floating diffusion part FD. As a result, the potential of the input node VIN of the column amplification unit 103 is lowered, and the output VOUT of the column amplification unit 103 is changed to have a higher level. In Section (a), because the output from the column amplification unit 103 is not as high as requiring a limiting operation by the column output limiting unit 110, the signal ATT keeps its low level. In other words, the gain of the column amplification unit 103 is maintained. On the other hand, in Section (b), because the output from the column amplification unit 103 is excessively high, it is limited by the column output limiting unit 110.

In response to the limitation operation on the output from the column amplification unit 103 performed by the column output limiting unit 110 at a time t13, the column control unit 106 changes the signal ATT to a high level. Because this turns on the switch Sf2, the gain of the column amplification unit 103 decreases from 1 time to ¼ times.

Then, after the signal PTX is changed to have a low level, the reference signal generation unit 104 at a time t14 monotonously increases the reference signal VRMP with time. The slope with time of the reference signal VRMP may be equal to that in the period from the time t10 to the time t11. In response to a change of the output VOUT of the column amplification unit 103 to be larger than the reference signal VRMP at a certain time, the logic level of the output of the column comparison unit 105 is inverted. In response thereto, the counting operation of the column counter unit 107 stops. Thus, an optical signal based on the charges generated in a photoelectric conversion unit is AD converted (S_AD in FIG. 8). After the counting operation stops, the counted value is transferred to the digital memory 108. For example, a signal processing unit, not illustrated, may be used to acquire a difference between a digital signal acquired by the operation performed during the period from the time t10 to the time t11 and a digital signal acquired by the operation performed during the period from the time t14 to the time t15 to perform a CDS process so that noise due to the reset of the column amplification unit 103 may be reduced.

The column control unit 106 stores an identification signal describing whether the column output limiting unit 110 has limited the output from the column amplification unit 103 or not in the digital memory 108. A circuit in a following stage is allowed to determine from the identification signal which gain setting is applied in the column amplification unit 103 to acquire the digital signal.

Also according to this embodiment, like the aforementioned embodiments, after both of the feedback capacitances Cf1 and Cf2 are reset, the feedback capacitance Cf2 is isolated from the feedback path of the amplifier amp. After that, when the output of the column amplification unit 103 is limited by the column output limiting unit 110, the feedback capacitance Cf2 is again connected to the feedback path of the amplifier amp. Thus, the charges due to switching noise caused by the switching on of the switch Sf2 are divided into the two feedback capacitances Cf1 and Cf2. Therefore, the influence of the switching noise may be reduced.

Having described that an amplification unit amp having one input is used as the column amplification unit 103, the column amplification unit 103 according to one of the first and second embodiments may be used.

Fourth Embodiment

Figure 9:
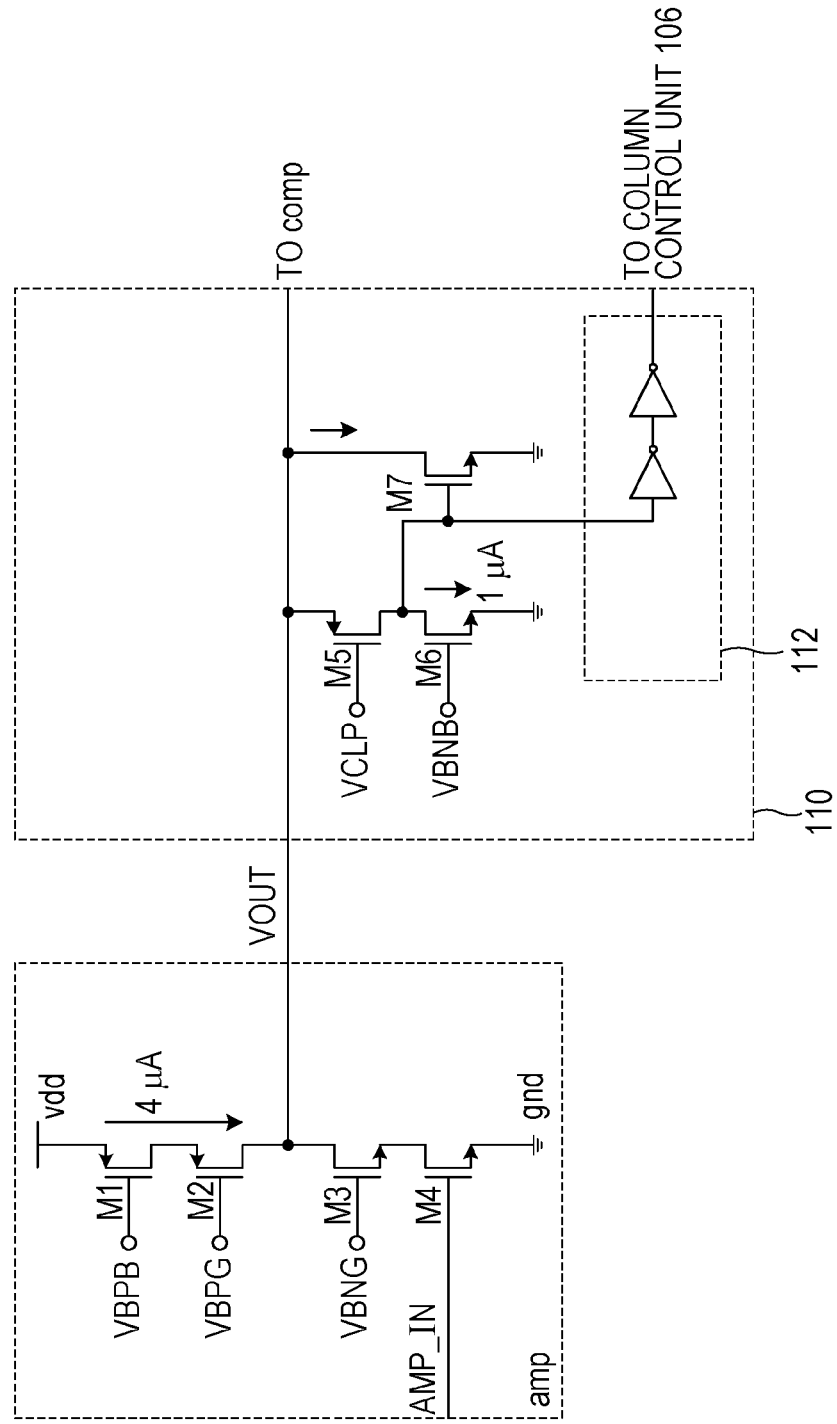
FIG. 9 is an equivalent circuit diagram illustrating configurations of an amplification unit and column output limiting unit.

FIG. 9 is an equivalent circuit diagram illustrating more detail configurations of the amplification unit amp and the column output limiting unit 110.

The amplification unit amp is a common-source amplification circuit including four transistors M1 to M4. The NMOS transistor M4 is an amplifying transistor in the common-source amplification circuit and has a gate receiving a signal to be amplified by the amplification unit amp. The NMOS transistor M3 is a common-gate transistor serially connected to the NMOS transistor M4. The PMOS transistors M1 and M2 are cascade-connected constant current loads. In this embodiment, 4 μA current may be supplied. Voltages VBPB, VBPG, and VBNG to be fed to gates of the PMOS transistors M1 and M2 and the NMOS transistor M3 are bias voltages for determining operation points of the corresponding transistors.

The column output limiting unit 110 includes transistors M5 to M7. The PMOS transistor M5 functions as a clip transistor. The PMOS transistor M5 has a source connected to the output node VOUT, a drain connected to a GND through the NMOS transistor M6 and connected to a gate of the NMOS transistor M7 and a judgment value output unit 112. A clip voltage VCLP is fed to the gate of the PMOS transistor M5. The NMOS transistor M6 is a transistor functioning as a load for sinking constant current when the PMOS transistor M5 is turned on, and its operation point is determined in accordance with a bias voltage VBNB. According to this embodiment, the NMOS transistor M6 is capable of supplying 1 μA current. The NMOS transistor M7 has a drain connected to the output node VOUT and a source connected to the GND. The judgment value output unit 112 includes a 2-stage inverter circuit. A signal output from the judgment value output unit 112 is input to the column control unit 106.

Next, operations to be performed by the column output limiting unit 110 according to this embodiment will be described. When the output of the amplification unit amp has a sufficiently low level, the PMOS transistor M5 has an OFF state. In this case, because the NMOS transistor M6 has an ON state, the NMOS transistor M7 has a gate voltage substantially equal to a GND level. Therefore, the NMOS transistor M7 also has an OFF state. As a result, because the PMOS transistor M5 and NMOS transistor M7 both have an OFF state, the column output limiting unit 110 does not substantially have an influence on the output from the amplification unit amp.

A case will be examined where a high luminance signal is input to the amplification unit amp and the potential of the output node VOUT rises, for example. When the source voltage of the PMOS transistor M5, that is, the voltage of the output node VOUT is larger than a threshold depending on the clip voltage VCLP, the PMOS transistor M5 is changed to have an ON state. At the same time, the gate voltage of the NMOS transistor M7 rises, and the NMOS transistor M7 is also changed to have an ON state. As a result, current fed from the load current sources M1 and M2 of the amplification unit amp are sank to the output limiting unit 110 as well as the NMOS transistors M3 and M4, and the output of the amplification unit amp is changed to have a clip state that the output does not rise to the value or larger. Thus, the output of the amplification unit amp may be limited.

The judgment value output unit 112 includes a 2-stage inverter and outputs a signal indicating that the gate voltage of the NMOS transistor M7 has increased. In other words, this signal indicates that the output limitation performed by the PMOS transistor M5 is active. The column control unit 106 having received the signal transmits a signal indicating that a clip operation has been performed, that is, the output of the amplification unit amp has been limited to a circuit in a following stage.

Figure 10:
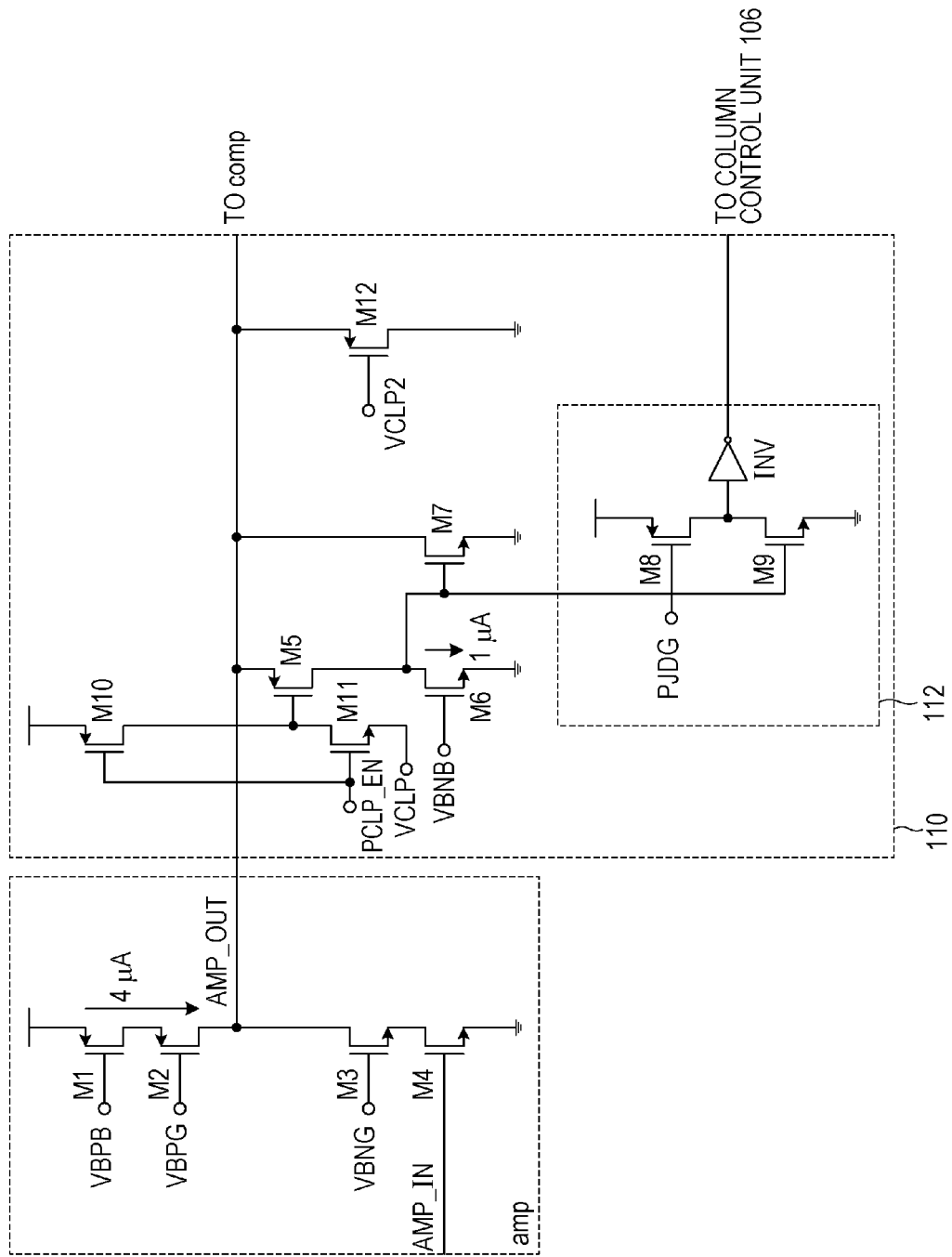
FIG. 10 is an equivalent circuit diagram illustrating configurations of an amplification unit and a column output limiting unit.

FIG. 10 illustrates another configuration example of the output limiting unit. In this configuration, two clip voltages which are threshold values for performing the output limitation operation by the amplification unit amp are settable. The first clip voltage VCLP to be fed to the PMOS transistor M5 which is a first clip transistor and the second clip voltage VCLP2 to be fed to a PMOS transistor M12 which is a second clip transistor have a relationship of VCLP<VCLP2.

The column output limiting unit 110 illustrated in FIG. 10 includes the transistors M5 to M12. The PMOS transistor M5 has a source connected to the output node VOUT and a drain connected to the GND through the NMOS transistor M6 and to gates of the NMOS transistor M7 and NMOS transistor M9. The PMOS transistor M5 has a gate connected to the output of an inverter circuit including the PMOS transistor M10 and NMOS transistor M11. The inverter circuit including the PMOS transistor M10 and NMOS transistor M11 supplies the clip voltage VCLP or vdd to the gate of the PMOS transistor M5 in accordance with a signal PCLP_EN. The NMOS transistor M6 is a transistor functioning as a load which sinks constant current when the PMOS transistor M5 is turned on, and its operation point is determined in accordance with the bias voltage VBNB. According to this embodiment, the NMOS transistor M6 is capable of supplying 1 μA current. The NMOS transistor M7 has a drain connected to the output node VOUT and a source connected to the GND.

The PMOS transistor M8 and NMOS transistor M9 correspond to the inverter circuit in the first stage of the 2-stage inverter circuit in FIG. 9.

Figure 11:
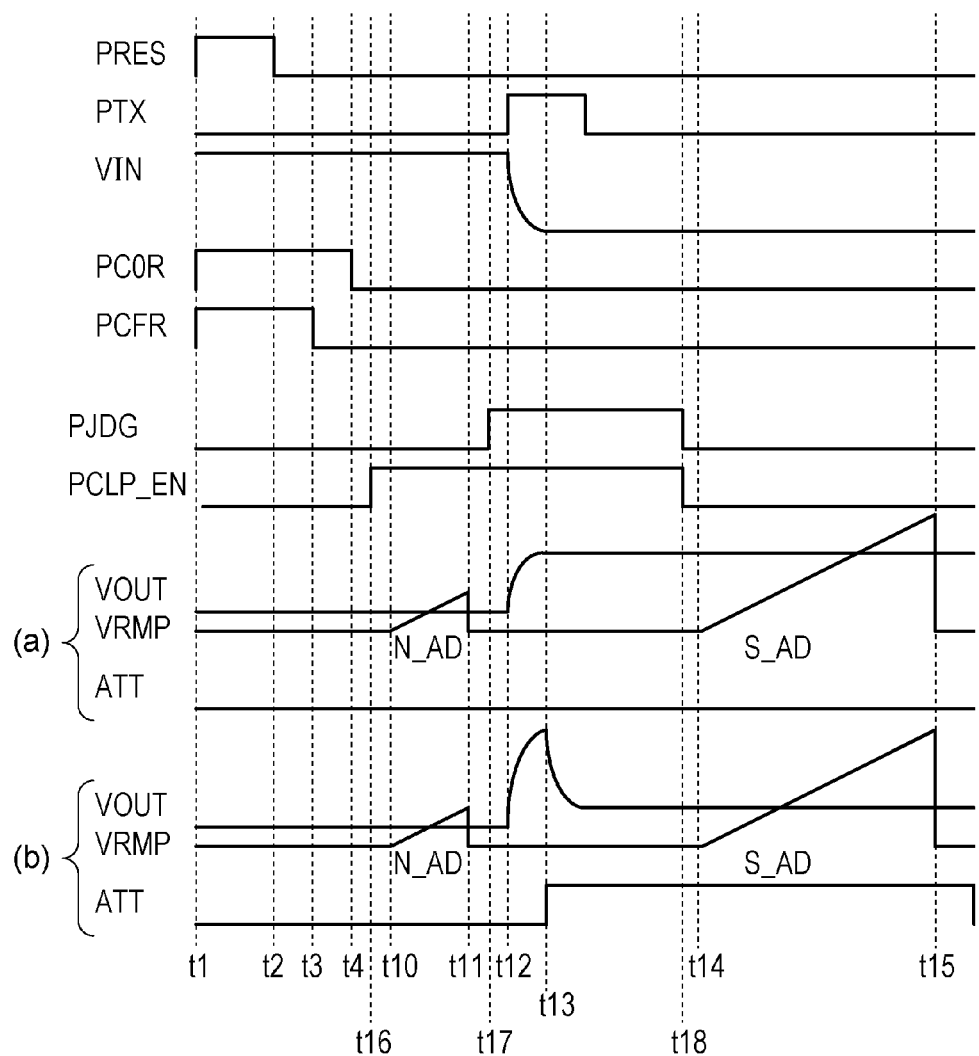
FIG. 11 is a timing chart for explaining operations according to a fourth embodiment.

FIG. 11 is a timing chart for explaining operations to be performed when the circuit illustrated in FIG. 10 is used. FIG. 11 is the same as FIG. 8 except that signals PJDG and PCLP_EN are added. Therefore, the description on the same operations as those in FIG. 8 will be omitted properly.

The signal PCLP_EN is changed to have a high level at a time t16 after the time t4 when the reset of the column amplification unit 103 completes. Thus, the PMOS transistor M5 is turned to have the gate voltage VCLP. At this point in time, both of the PMOS transistors M5 and M12 may function as clip transistors. However, the PMOS transistor M5 is activated based on the relationship VCLP2>VCLP.

Before the time t12 when the signal PTX is changed to have a high level, the signal PJDG is changed to have a high level from a time t17. Thus, the output from the inverter circuit including the PMOS transistor M8 and NMOS transistor M9 has a high impedance state. As a result, the output from the inverter circuit is held at a high level by parasitic capacitance existing.

When a high luminance signal is input to the column amplification unit 103 from the time t12, the PMOS transistor M5 is turned on. Thus, the gate voltages of the NMOS transistors M7 and M9 increase, and the output from the inverter including the transistors M8 and M9 is inverted to a low level. Based on the signal, the column control unit 106 shifts the signal ATT to a high level. Then, the signals PCLP_EN and PJDGAD are shifted to a low level at a time t18 before the time t14 when a conversion is started. Thus, the PMOS transistor M5 and the judgment value output unit 112 are shifted to a non-operational state, and the PMOS transistor M12 is only activated.

This is effective for more securely turning off the PMOS transistor M5. The clip voltage VCLP is fed to the gate of the PMOS transistor M5 and the voltage of the output node VOUT is slightly lower than a threshold voltage depending on the clip voltage VCLP, the PMOS transistor M5 may operate in a sub-threshold region. When the PMOS transistor M5 performs such a sub-threshold operation, the amplification unit amp may not possibly output a proper value. Accordingly, the processing as described above may securely shift the PMOS transistor M5 to an OFF state.

Fifth Embodiment

Figure 12:
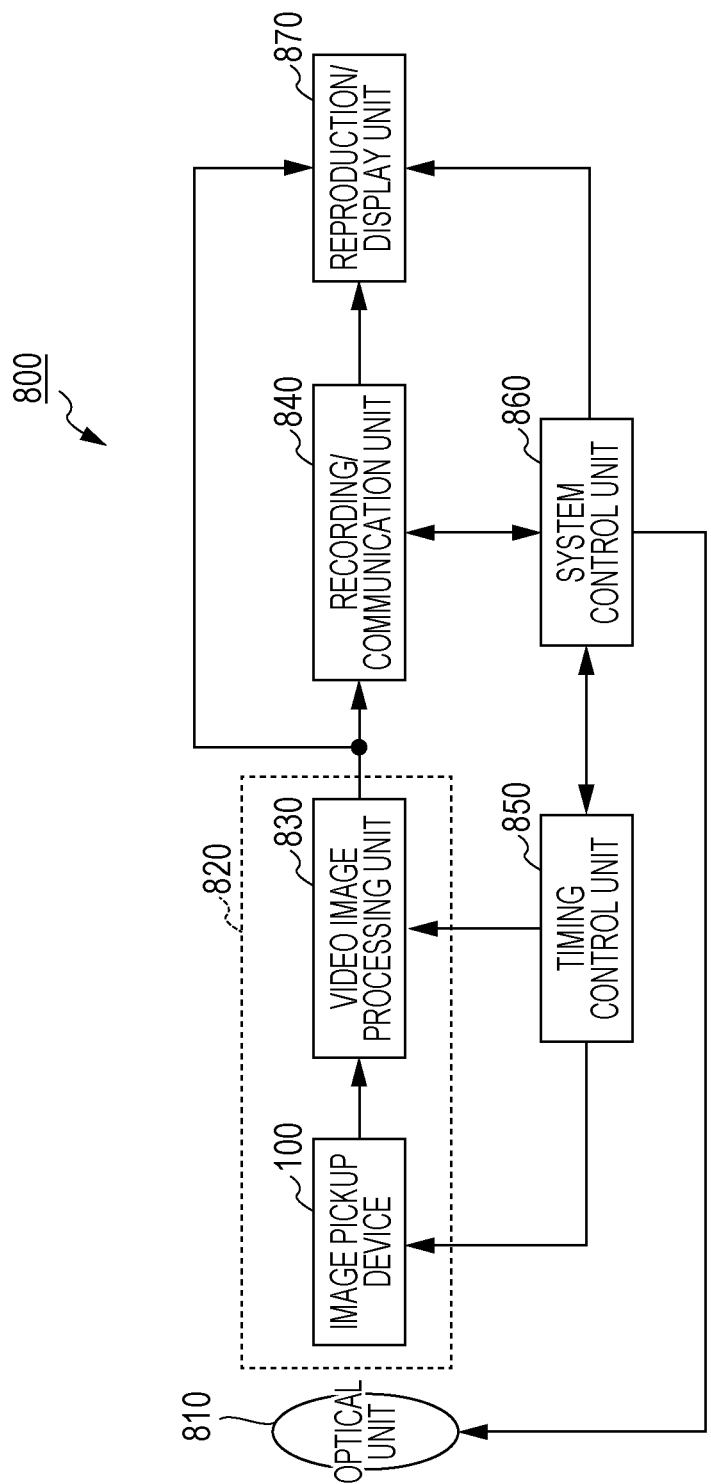
FIG. 12 is a block diagram illustrating a configuration example of an imaging system.

FIG. 12 illustrates a configuration example of an imaging system. An imaging system 800 may include, for example, optical unit 810, an image pickup device 100, a video signal processing unit 830, a recording/communication unit 840, a timing control unit 850, a system control unit 860, and a reproduction/display unit 870. The imaging apparatus 820 has the image pickup device 100 and the video signal processing unit 830. The image pickup device 100 may be a photoelectric conversion apparatus according to one of the aforementioned embodiments.

The optical unit 810 which is an optical system such as a lens focuses light from a photographic subject to form an image of the photographic subject in a pixel part 10 including a plurality of pixels arranged two-dimensionally in the image pickup device 100. The image pickup device 100 outputs a signal according to the light imaged in the pixel part 10 at a time point based on the signal from the timing control unit 850. The signal output from the image pickup device 100 is input to the video signal processing unit 830 which is a video signal processing unit, and the video signal processing unit 830 performs a signal process according to a method defined in a program, for example. The signal acquired by the process performed by the video signal processing unit 830 is transmitted to the recording/communication unit 840 as image data. The recording/communication unit 840 transmits the signal for forming an image to the reproduction/display unit 870 and causes the reproduction/display unit 870 to reproduce and display the corresponding moving image or a still image. The recording/communication unit 840 receives the signal from the video signal processing unit 830 and communicates with the system control unit 860 and performs an operation for recording a signal for forming an image in a recording medium, not illustrated.

The system control unit 860 is configured to generally control operations performed by the imaging system optical unit 810 and controls driving of the timing control unit 850, recording/communication unit 840, and reproduction/display unit 870. The system control unit 860 may include a storage device, not illustrated, which is a recording medium, for example, and a program for controlling an operation performed by the imaging system is stored in the storage device. The system control unit 860 may supply a signal for switching the drive mode or sensitivity in accordance with a user operation, for example. Specific examples thereof may include a change of the row to be read out or be reset, a change of the field angle for electronic zooming, and a movement of a field angle for electronic vibration-proof. When the sensitivity of the imaging system is switched in accordance with a user input, the sensitivity of the image pickup device 100 is also switched in accordance with the switching. In other words, the system control unit 860 functions as a sensitivity selection unit for selecting the sensitivity of the imaging system 800, and the sensitivity of the image pickup device 100 is also switched in accordance with the selected sensitivity.

The timing control unit 850 is configured to control driving timing of the image pickup device 100 and video signal processing unit 830 under control performed by the system control unit 860. The timing control unit 850 may also function as a sensitivity setting unit configured to set the imaging sensitivity of the image pickup device 100.

According to the present invention, an offset error caused when the gain of an amplification unit is switched may be reduced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-158961, filed Aug. 4, 2014, which is hereby incorporated by reference herein in its entirety.

What is claimed is:

1. A driving method for a photoelectric conversion apparatus, the photoelectric conversion apparatus including
    a pixel array having a plurality of pixels arranged in a matrix form; and
    a plurality of column signal processing units each provided corresponding to a column of the pixel array,
    each of the column signal processing units including a column amplification unit having
    an amplifier;
    a first capacitance; and
    a second capacitance provided in parallel with the first capacitance; and
    amplifying a signal output from the pixel array,
    the method comprising:
    establishing a short circuit between an input node and an output node of the amplifier by switching a reset switch to an ON state in a state that the first and the second capacitances are electrically connected between the input node and output node of the amplifier;
    after the short circuit is established between the input node and the output node of the amplifier, electrically isolating the second capacitance from at least one of the input and output nodes of the amplifier,
    switching the reset switch from the ON state to an OFF state, and
    if an output from the amplifier is larger than a threshold while the reset switch is in the OFF state, electrically connecting the second capacitances to the input and output nodes off the amplifier.

2. The driving method according to claim 1, wherein the threshold is a saturation level of an output of the amplifier.

3. The driving method according to claim 1, further comprising limiting, in a case that an output from the amplifier is larger than the threshold, the output not to exceed the threshold.

4. The driving method according to claim 1, wherein a signal indicating whether an output from the amplifier is larger than the threshold or not is output.

5. The driving method according to claim 1, wherein each of the plurality of column signal processing units has a switching unit configured to switch the capacitances to be connected to at least one of the input and output nodes of the amplifier between the first capacitance and the second capacitances.

6. The driving method according to claim 1, wherein each of the plurality of column signal processing units has an analog-digital (AD) converter, and the AD converter performs an AD conversion on a signal output from the amplifier.

7. A photoelectric conversion apparatus comprising:
a pixel array having a plurality of pixels arranged in a matrix form; and
a plurality of column signal processing units each provided corresponding to a column of the pixel array,
each of the column signal processing units including a column amplification unit having
an amplifier;
a first capacitance; and
a second capacitance provided in parallel with the first capacitance; and
amplifying a signal output from the pixel array,
wherein the photoelectric conversion apparatus
establishes a short circuit between an input node and an output node of the amplifier by switching a reset switch to an ON state in a state that the first and the second capacitances are electrically connected between the input node and output node of the amplifier;
after the short circuit is established between the input node and the output node of the amplifier, electrically isolates second capacitance from at least one of the input and output nodes of the amplifier,
switches the reset switch from the ON state to an OFF state, and
if an output from the amplifier is larger than a threshold while the reset switch is in the OFF state, electrically connects the second capacitances to the input and output modes of the amplifier.

8. The photoelectric conversion apparatus according to claim 7, wherein each of the plurality of column signal processing units further has a column comparison unit configured to compare an output from the amplifier and the threshold.

9. The photoelectric conversion apparatus according to claim 7, wherein
each of the plurality of column signal processing units further has an output limiting unit configured to limit an output from the amplifier
in a case that the output is larger than the threshold.

10. The photoelectric conversion apparatus according to claim 9, wherein each of the plurality of column signal processing units further has a judgment value output unit, and the output limiting unit outputs a signal indicating that an output of the amplifier is limited.

11. The photoelectric conversion apparatus according to claim 7, wherein each of the plurality of column signal processing units has a switching unit configured to switch the capacitances to be connected to at least one of the input and output nodes of the amplifier between the first capacitance and the second capacitances.

12. The photoelectric conversion apparatus according to claim 7, wherein each of the plurality of column signal processing units has an analog-digital (AD) converter, and the AD converter performs an AD conversion on a signal output from the amplifier.

13. An imaging system comprising:
the photoelectric conversion apparatus;
an optical system configured to form an image in the pixel array; and
a video signal processing unit configured to generate image data by processing a signal output from the photoelectric conversion apparatus,
wherein the photoelectric conversion apparatus comprises:
a pixel array having a plurality of pixels arranged in a matrix form; and
a plurality of column signal processing units each provided corresponding to a column of the pixel array,
each of the column signal processing units including a column amplification unit having
an amplifier;
a first capacitance; and
a second capacitance provided in parallel with the first capacitance; and
amplifying a signal output from the pixel array,
wherein the photoelectric conversion apparatus
establishes a short circuit between an input node and an output node of the amplifier by switching a reset switch to an ON state in a state that the first and the second capacitances are electrically connected between the input node and output node of the amplifier;
after the short circuit is established between the input node and the output node of the amplifier, electrically isolates the second capacitance from at least one of the input and output nodes of the amplifier,
switches the reset switch from the ON state to an OFF state, and
if an output from the amplifier is larger than a threshold while the reset switch is in the OFF state, electrically connects the second capacitances to the input and output nodes from the amplifier.

14. The imaging system according to claim 13, wherein, in the photoelectric conversion apparatus, each of the plurality of column signal processing units further has a column comparison unit configured to compare an output from the amplifier and the threshold.

15. The imaging system according to claim 13, wherein, in the photoelectric conversion apparatus, each of the plurality of column signal processing units further has an output limiting unit configured to limit an output from the amplifier in a case the output is larger than the threshold.

16. The imaging system according to claim 15, wherein, in the photoelectric conversion apparatus, each of the plurality of column signal processing units further has a judgment value output unit, and the output limiting unit outputs a signal indicating that an output of the amplifier is limited.

17. The imaging system according to claim 13, wherein, in the photoelectric conversion apparatus, each of the plurality of column signal processing units has a switching unit configured to switch the capacitances to be connected to at least one of the input and output nodes of the amplifier between the first capacitance and the second capacitances.

18. The imaging system apparatus according to claim 13, wherein, the photoelectric conversion apparatus, each of the plurality of column signal processing units has an analog-digital (AD) converter, and the AD converter performs an AD conversion on a signal output from the amplifier.

* * * * *